United States Patent [19]
Yanagiuchi

[11] Patent Number: 5,896,428
[45] Date of Patent: Apr. 20, 1999

[54] DIGITAL COUNTER AND DIGITAL PHASE LOCKED LOOP CIRCUIT USING SAME

[75] Inventor: Hiroshi Yanagiuchi, Kanagawa, Japan

[73] Assignee: Sony Corporation, Japan

[21] Appl. No.: 08/714,275

[22] Filed: Sep. 17, 1996

[30] Foreign Application Priority Data

Sep. 20, 1995 [JP] Japan ................... 7-242044

[51] Int. Cl.$^6$ ........................................... H03L 7/081
[52] U.S. Cl. ..................... 375/374; 375/376; 327/159;
327/160; 331/17; 331/25; 331/DIG. 2
[58] Field of Search .......................... 375/373, 374,
375/376; 327/107, 147, 156, 159, 160;
331/17, 18, 25, DIG. 2; 455/260

[56] References Cited

U.S. PATENT DOCUMENTS

| | | | |
|---|---|---|---|
| 4,272,729 | 6/1981 | Riley, Jr. | 331/1 A |
| 5,517,155 | 5/1996 | Yamauchi et al. | 331/1 A |
| 5,604,775 | 2/1997 | Saitoh et al. | 375/376 |
| 5,651,036 | 7/1997 | Hee et al. | 375/374 |

*Primary Examiner*—Amanda Le
*Attorney, Agent, or Firm*—Ronald P. Kananen

[57] ABSTRACT

A digital counter comprised of a synchronization judgement circuit and a counting circuit, the synchronization judging circuit receiving as an input signal the results of a comparison from a phase comparison circuit which compares the phase of a reference signal and an output signal of a frequency factoring circuit and outputting a phase synchronization judgement signal to the counting circuit, the counting circuit receiving as input the results of comparison and the phase synchronization judgement signal, performing a count based on the results of comparison, and successively determining a count from the most significant bit to the least significant bit. Also, a digital PLL circuit using the digital counter.

13 Claims, 8 Drawing Sheets

DIGITAL COUNTER AND DIGITAL PHASE LOCKED LOOP CIRCUIT USING SAME

BACKGROUND OF THE INVENTION

1. Field of the Invention

The present invention relates to a digital phase locked loop (PLL) circuit and to a digital counter used for configuring that digital PLL circuit.

2. Description of the Related Art

A usual digital PLL circuit is, for example, comprised of a phase comparator, a digital counter, a frequency multiplier, and a frequency divider. It compares the phase of a reference clock and the phase of a feedback loop signal at the phase comparator, sets the data of the digital counter so as to minimize the phase error, and decides on the multiplying factor of the frequency multiplier or the dividing factor of the frequency divider based on that set data. To reduce the jitter, however, the number of bits of the digital counter must be increased. If the number of bits is increased, however, it takes time to minimize the phase error. That is, there is an inverse relationship between the reduction of the jitter and the reduction of the time taken for phase locking.

SUMMARY OF THE INVENTION

An object of the present invention is to provide a digital counter and a digital PLL circuit achieving both the reduction of the jitter and the reduction of the time taken for phase locking.

According to a first aspect of the present invention, there is provided a digital counter comprising a synchronization judging means and a counting means. The synchronization judging means receives as an input signal the results of a comparison from a phase comparison circuit which compares the phase of a reference signal and an output signal of a frequency factoring means and outputs a phase synchronization judgement signal to the counting means. The counting means receives as input the results of comparison and the phase synchronization judgement signal, performs a count based on the results of the comparison, and successively determining a count from the most significant bit to the least significant bit.

Preferably, the counting means has a first counting means and a second counting means. The first counting means successively determines the count from the most significant bit to the least significant bit based on the results of the comparison until the phase is synchronized with the output signal of the frequency factoring means based on the output of the synchronization judging means, and the second counting means changes the count from the least significant bit to the most significant bit based on the results of the comparison after synchronization of the phase of the reference signal and the output signal of the frequency factoring means.

According to a second aspect of the invention, there is provided a digital PLL circuit comprising a frequency factoring means, a phase comparing means for comparing the phase of a reference signal and an output signal of the frequency factoring means, and a digital counter which receives as its input the results of the comparison from the phase comparing means, successively determines the count from the most significant bit to the least significant bit based on the results of the comparison, and outputs the count to the frequency factoring means.

Preferably, the frequency factoring means is comprised of a frequency multiplying means and a frequency dividing means connected in cascade.

Preferably, the position of the most significant bit of the counting means is determined based on the period of the reference signal and the factor of the frequency factoring means.

Preferably, the count is successively determined from the most significant bit to the least significant bit based on the results of the comparison until the phases of the reference signal and the output signal of the frequency factoring means are synchronized and the count is changed from the least significant bit to the most significant bit based on the results of the comparison after the phases of the reference signal and the output signal of the frequency factoring means are synchronized.

The digital counter of the present invention receives as input the results of a comparison from a phase comparison circuit comparing the phases of a reference signal and the output signal of a frequency multiplication circuit, performs a count based on the results of comparison, and outputs the count to the frequency multiplication circuit. Based on the results of the comparison, it successively determines the count from the most significant bit to the least significant bit.

Further, the digital counter of the present invention may determine the position of the most significant bit in the count based on the period of the reference signal and the multiplying factor of the frequency multiplication circuit.

The digital counter of the present invention may also successively determine the count from the most significant bit to the least significant bit based on the results of the comparison until the reference clock and the output signal of the frequency multiplication circuit are synchronized in phase and change the count from the least significant bit to the most significant bit based on the results of the comparison after the reference signal and the output signal of the frequency multiplication circuit are synchronized in phase.

The digital counter of the present invention may also have a first counter, a second counter, and a selecting means. The selecting means outputs to the first counter the results of the comparison until the reference signal and the output signal of the frequency multiplication circuit are synchronized in phase and outputs the results to the second counter after the reference signal and the output signal of the frequency multiplication circuit are synchronized in phase. The first counter successively determines the count from the most significant bit to the least significant bit based on the results of comparison input from the selecting means, and the second counter uses the count of the first courter as its initial value and changing the count from the least significant bit to the most significant bit based on the results of the comparison input from the selecting means.

The digital PLL circuit of the present invention has a frequency multiplication circuit, a phase comparison circuit for comparing the reference signal and the output signal of the frequency multiplication circuit, and a digital counter which receives as input the results of the comparison from the phase comparison circuit, successively determines the count from the most significant bit to the least significant bit based on the results of comparison, and outputs the count to the frequency multiplication circuit.

The digital PLL circuit of the present invention may have a digital counter which determines the position of the most significant bit in the count based on the period of the reference signal and the multiplying factor of the frequency multiplication circuit.

The digital PLL circuit of the present invention may also have a digital counter which successively determines the count from the most significant bit to the least significant bit

3 based on the results of the comparison until the reference clock and the output signal of the frequency multiplication circuit are synchronized in phase and which changes the count from the least significant bit to the most significant bit based on the results of the comparison after the reference signal and the output signal of the frequency multiplication circuit are synchronized in phase.

The digital PLL circuit of the present invention may also have a digital counter which has a first counter, second counter, and a selecting means. The selecting means outputs to the first counter the results of the comparison until the reference signal and the output signal of the frequency multiplication circuit are synchronized in phase and outputs the results to the second counter after the reference signal and the output signal of the frequency multiplication circuit are synchronized in phase. The first counter successively determines the count from the most significant bit to the least significant bit based on the results of the comparison input from the selecting means, and the second counter uses the count of the first counter as its initial value and changes the count from the least significant bit to the most significant bit based on the results of the comparison input from the selecting means.

In the digital counter and the digital PLL circuit of the present invention, for example, "1" is set in the most significant bit and the output signal of the frequency multiplication circuit obtained based on this set value and the reference signal are compared in the phase comparison circuit. Further, when the result of the comparison is for example that the period of the output signal of the frequency multiplication circuit is shorter than the reference signal, the set most significant bit is determined to be "1", while in other cases, it is changed to "0". Then, the processing is successively performed from the most significant bit to the least significant bit to determine the values of the individual bits.

BRIEF DESCRIPTION OF THE DRAWINGS

These and other objects and features of the present invention will become clearer from the following description of the preferred embodiments made with reference to the attached drawings, in which.

4

DESCRIPTION OF THE PREFERRED EMBODIMENTS

First Embodiment

Figure 1:
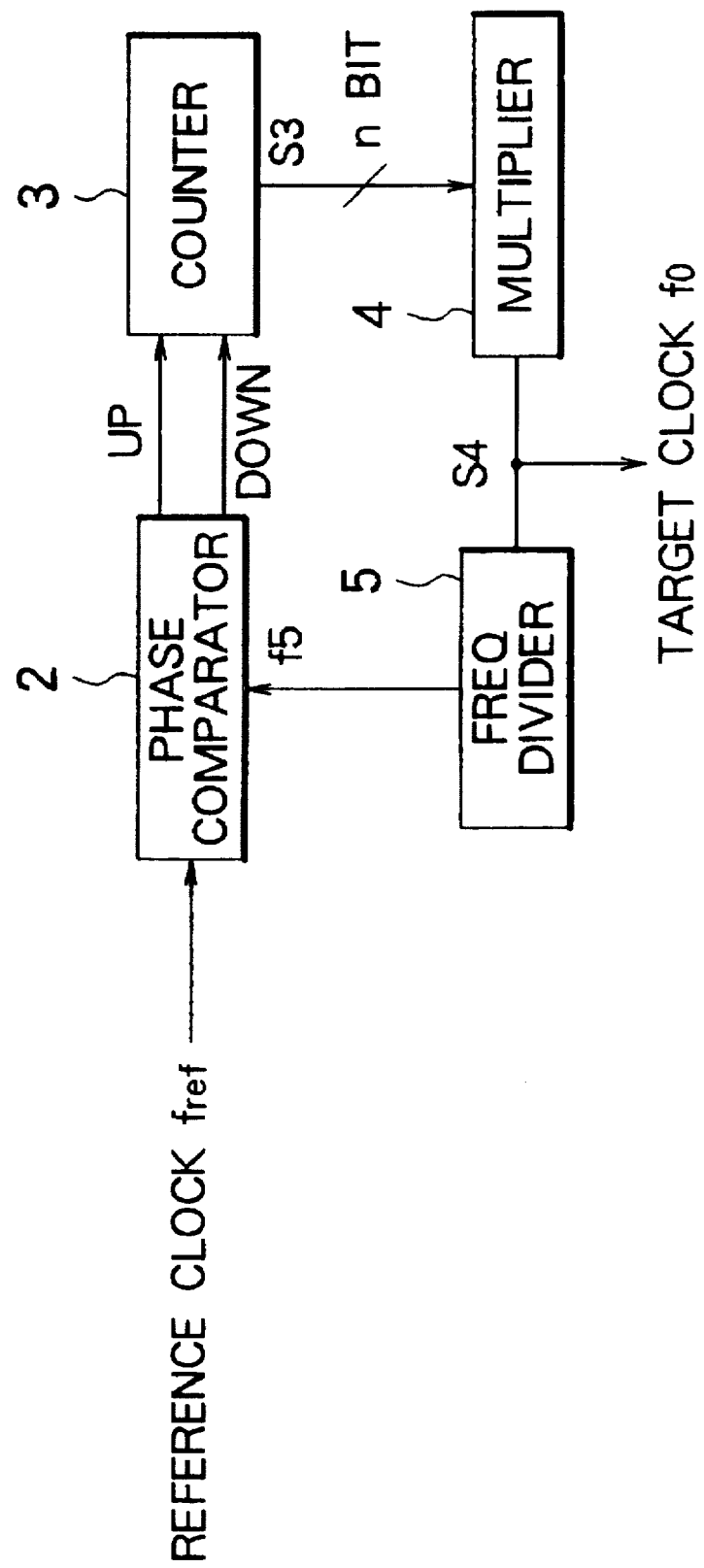
FIG. 1 is a view of the configuration of a digital PLL circuit according to a first embodiment of the present invention.

As shown in FIG. 1, a digital PLL circuit according to a first embodiment of the present invention has for example a phase comparator 2, digital counter 3, frequency multiplier 4, and frequency divider 5.

The phase comparator 2 compares the phases of a reference clock of a frequency $f_{ref}$ and an oscillation output $f_s$ from the frequency divider 5 and outputs an up/down signal in accordance with the results of the comparison to the digital counter 3. For example, when the period of the oscillation output $f_s$ is shorter than the reference clock, it outputs an up signal to the digital counter 3, while in the reverse case, it outputs a down signal to the digital counter 3.

The digital counter 3 changes the count up and down from the least significant bit to the most significant bit based on the up/down signal from the phase comparator 2 and outputs a n-bit count S3 to the frequency multiplier 4.

The frequency multiplier 4 performs a similar function as a voltage-controlled oscillator (VCO). It determines the oscillation frequency by the input count S3 and finally outputs a target clock of the frequency $f_o$.

The frequency divider 5 outputs to the phase comparator 2 an oscillation output $f_s$ obtained by dividing the output signal S4 from the frequency multiplier 4.

Figure 2A:
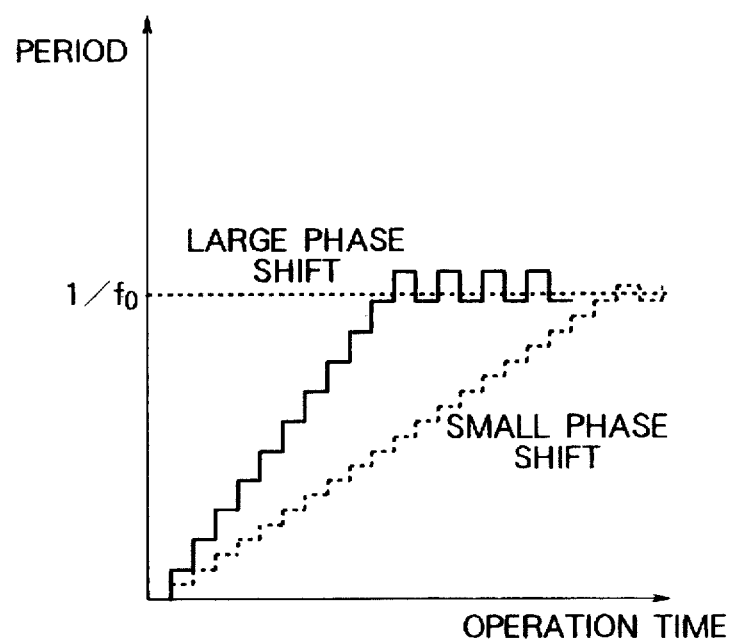
FIGS. 2A to 2B are views explaining the operation of the digital counter shown in FIG. 1.

In the digital PLL circuit shown in FIG. 1, as shown in FIG. 2A, it takes an operating time of as long as $2^n/f_{ref}$ to achieve the locked state when the digital counter 3 is made an n-bit counter.

Figure 2B:
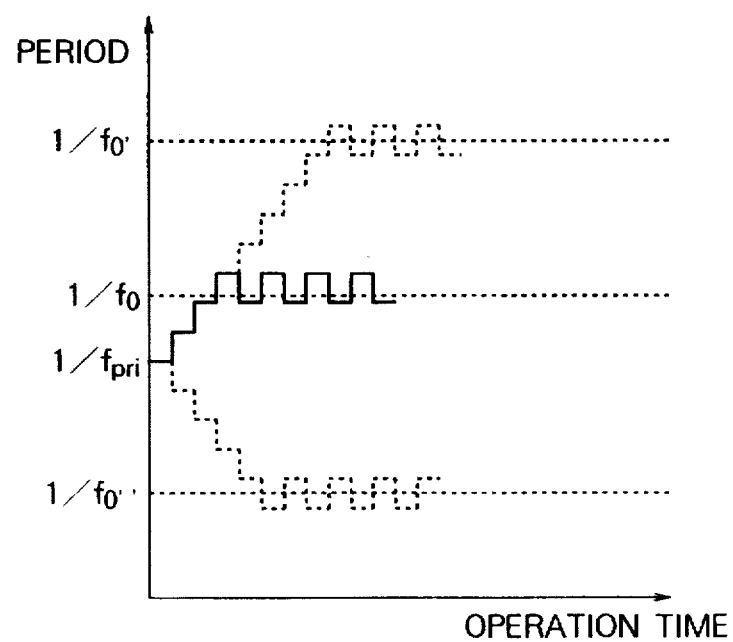

Further, as shown in FIG. 2B, there is a technique for shortening the time until the locked state is reached by setting the initial value of the count to a frequency $f_{pri}$ in proximity to the target frequency $f_o$, but the effect of this technique cannot be suitably achieved when the target frequency $f_o$ changes to for example $f_o'$ or $f_o''$.

Accordingly, in the digital PLL circuit shown in FIG. 1, it is necessary to reduce the number of bits of the digital counter 3 so as to shorten the time until the locked state is reached.

On the other hand, in the digital PLL circuit shown in FIG. 1, when controlling the frequency multiplier 4 by the count S3 of the digital counter 3, the phase shift of the frequency is weighted for each bit of the count S3. If the phase shift is large, however, the jitter becomes large, so satisfaction of the precision required for the output frequency of the digital PLL circuit requires that the number of bits of the digital counter 3 be increased and the amount of the phase shift be reduced as much as possible.

Second Embodiment

Figure 3:
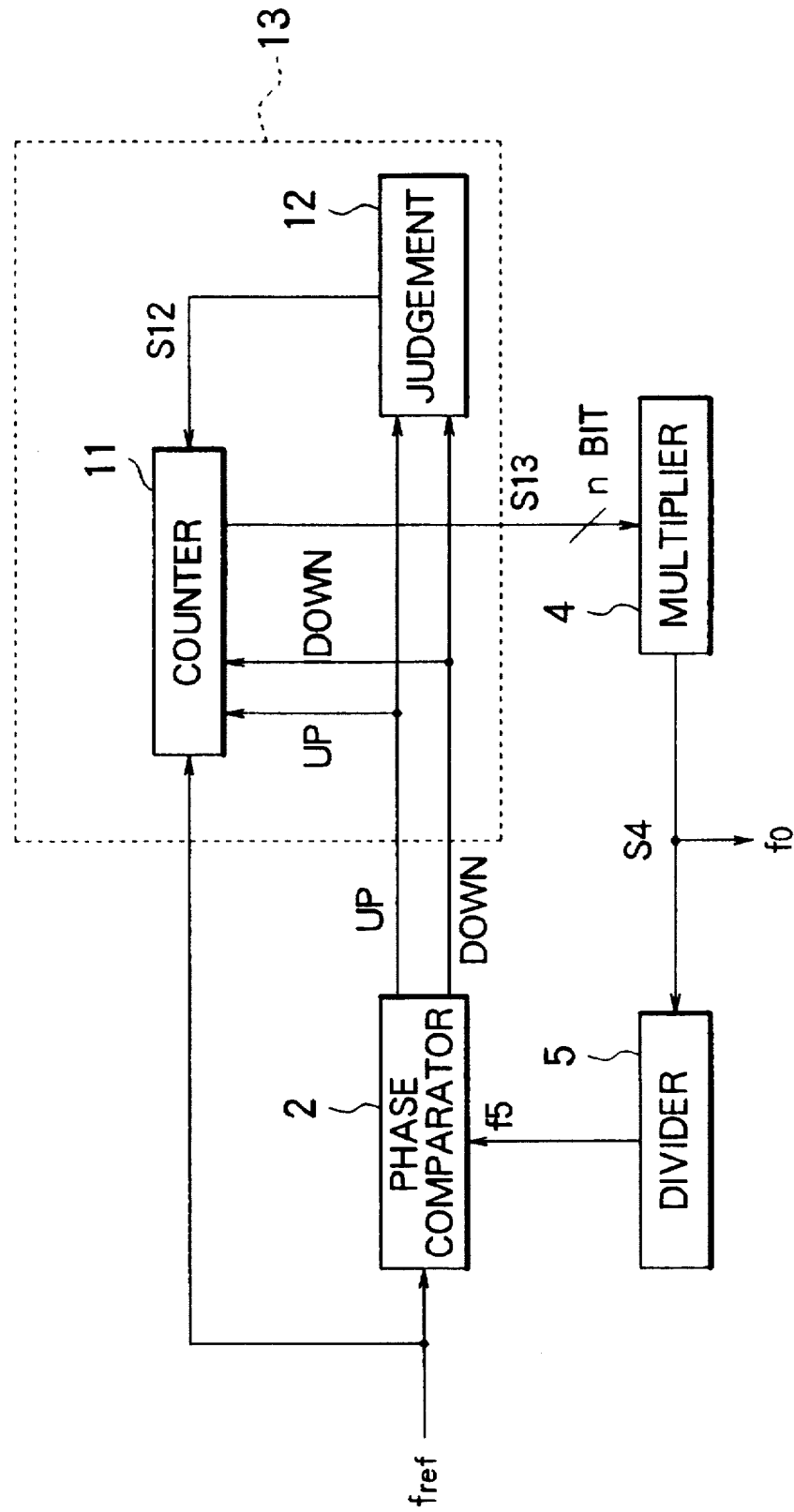
FIG. 3 is a view of the configuration of a digital PLL circuit according to a second embodiment of the present invention.

FIG. 3 is a view of the configuration of a digital PLL circuit according to a second embodiment of the present invention.

As shown in FIG. 3, the digital PLL circuit according to this embodiment has a phase comparator 2, digital counter 13, frequency multiplier 4, and frequency divider 5.

The phase comparator 2 compares the phases of a reference clock of a frequency $f_{ref}$ and an oscillation output $f_s$ from the frequency divider 5 and outputs an up/down signal in accordance with the results of the comparison to the digital counter 3. For example, when the period of the oscillation output $f_s$ is shorter than the reference clock, it outputs an up signal to the digital counter 3, while in the reverse case, it outputs a down signal to the digital counter 3.

The frequency multiplier 4 performs a similar function as a voltage-controlled oscillator (VCO). It determines the oscillation frequency by the input count S3 and finally outputs a target clock of the frequency $f_0$.

The frequency divider 5 outputs to the phase comparator 2 an oscillation output $f_s$ obtained by dividing the output signal S4 from the frequency multiplier 4.

Further, all of the components of the digital PLL circuit operate based on the reference clock or a clock produced from the reference clock.

The digital counter 13 will be explained below.

The digital counter 13 has a multi-counter 11 and a synchronization judgement circuit 12.

The multi-counter 11 receives as its input the reference clock of the frequency $f_{ref}$, the up/down signal from the phase comparator 2, and the synchronization judgement signal S12 from the synchronization judgement circuit 12 and determines the output of the bits from the most significant bit (MSB) of the count to the least significant bit (LSB) based on the up/down signal from the phase comparator 2 until just before judging that the frequency $f_{ref}$ of the reference clock and the target frequency $f_0$ are synchronized in phase referring to the synchronization judgement signal S12. Further, the multi-counter 11 counts from the least significant bit based on the up/down signal from the phase comparator 2 from just after judging that the frequency $f_{ref}$ of the reference clock and the target frequency $f_0$ are synchronized in phase referring to the synchronization judgement signal S12. The n-bit count S13 of the multi-counter 11 is output to the frequency multiplier 4.

The synchronization judgement circuit 12 judges if phase synchronization has been established based on the up/down signal from the phase comparator 2 and outputs the synchronization judgement signal S12 to the multi-counter 11.

Next, the operation of the digital counter 13 will be explained.

Figure 4:
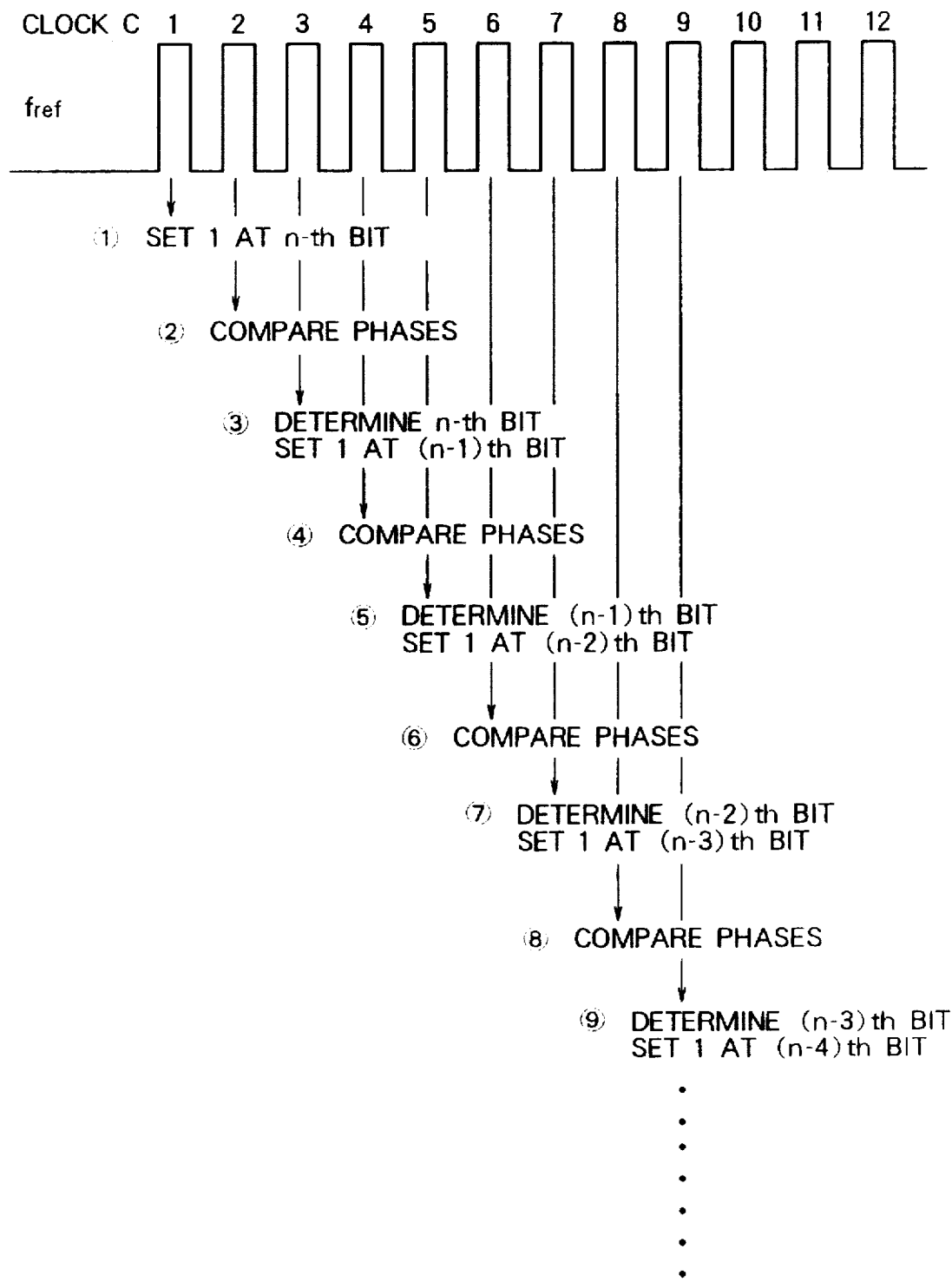
FIG. 4 is a view explaining the operation of the digital counter shown in FIG. 3.
Figure 5:
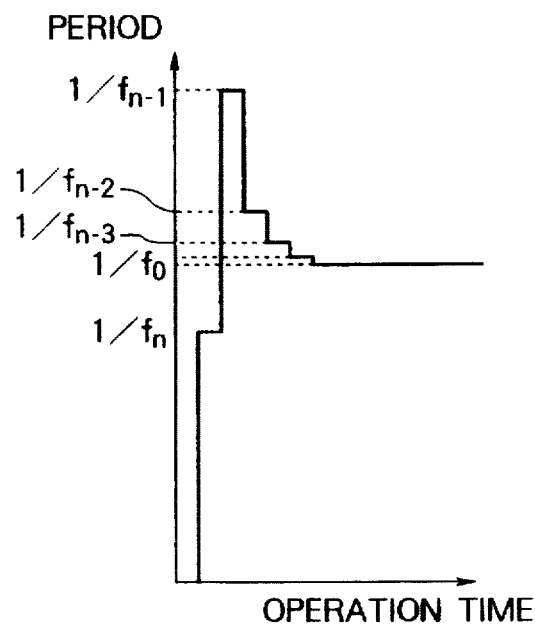
FIG. 5 is a time chart of the operation of the digital counter shown in FIG. 3.

FIG. 4 and FIG. 5 are views for explaining the operation of the digital counter 13.

In the digital counter 13, the n-th bit is selected in advance as the most significant bit.

Next, as shown in FIG. 4, at the clock C1 in the reference clocks of the frequency $f_{ref}$, "1" is set in the n-th bit. The period of the output from the frequency multiplier 4 at this time becomes the "$1/f_n$" shown in FIG. 5. Here, the target frequency $f_0$ is a value matching a frequency of a multiple of the frequency $f_{ref}$ of the reference clocks or a value extremely close to the same.

Next, at the clock C2 shown in FIG. 4, the frequency $f_{ref}$ of the reference clock and the frequency $f_n$ are compared in phase at the phase comparator 2.

Next, at the clock C3, since the phase comparison at the clock C2 shows that it is necessary to extend the period, an up signal is output from the phase comparator 2 to the multi-counter 11. Accordingly, the multi-counter 11 determines the n–th bit to be "1" and sets the n–1st bit to "1". The period of the output from the frequency multiplier 4 at this time becomes the "$1/f_{n-1}$" shown in FIG. 5.

Next, at the clock C4 shown in FIG. 4, the frequency $f_{ref}$ of the reference clock and the frequency $f_{n-1}$ are compared in phase at the phase comparator 2.

Next, at the clock C5, since the phase comparison at the clock C4 shows that it is necessary to shorten the period, a down signal is output from the phase comparator 2 to the multi-counter 11. Accordingly, the multi-counter 11 determines the n–1st bit to be "0" and sets the n–2nd bit to "1". The period of the output from the frequency multiplier 4 at this time becomes the "$1/f_{n-2}$" shown in FIG. 5.

Next, at the clock C6 shown in FIG. 4, the frequency $f_{ref}$ of the reference clock and the frequency $f_{n-2}$ are compared in phase at the phase comparator 2.

Next, at the clock C7, since the phase comparison at the clock C6 shows that it is necessary to shorten the period, a down signal is output from the phase comparator 2 to the multi-counter 11. Accordingly, the multi-counter 11 determines the n–2nd bit to be "0" and sets the n–3rd bit to "1". The period of the output from the frequency multiplier 4 at this time becomes the "$1/f_{n-3}$" shown in FIG. 5.

Next, processing similar to the above is repeated until the synchronization judgement signal S12 from the synchronization judgement circuit 12 shows that synchronization is established.

According to the digital PLL circuit explained above, by performing the above processing to determine the count S13 from the multi-counter 11, it is possible to make the final frequency $f_0$ of the output from the frequency multiplier 4 approach a frequency of a multiple of the frequency $f_{ref}$ of the reference clock free from phase deviation in a short time and with a high degree of precision. That is, while the time until the locked state was $2^n$ clocks of the reference clock in the conventional digital counter explained above, it is only 2n clocks (in FIG. 7, 2(n+1) clocks) in the digital counter 13 of this embodiment. Therefore, by using the digital counter 13 of this embodiment, it is possible to reach the locked state in a short time. For example, when n =10, while it used to take $2^{10}$=1024 clocks for the phase lock, it takes just 2×10=20 clocks (in FIG. 7, 2(10+1)=22 clocks) in this embodiment, so the time until reaching a locked state can be reduced to about 1/50th of the previous required time. As a result, from the relationship with the processing time, it is possible to greatly increase the number of bits of the digital counter 13 compared with the past and therefore possible to greatly improve the precision of the output frequency of the digital PLL circuit. Accordingly, by the digital PLL circuit according to this embodiment, it is possible to achieve both a higher precision of the output frequency and a shorter time until reaching the locked state and possible to apply the digital counter to a broad range of fields such as use as a digital PLL circuit for display scanning.

Next, when the synchronization judgement signal S12 shows that synchronization has been established, the multi-counter 11 is switched to the up/down counter for counting the count S12 from the least significant bit in accordance with the change of the frequency $f_{ref}$ of the reference clock.

In this way, after phase synchronization, a high precision phase synchronization tracking errors in the circuit and reference clock can be obtained by switching the multi-counter 11 to the up/down counter for counting from the least significant bit. Further, according to the digital PLL circuit of this embodiment, the phase is compared at a rate of once every two clocks, so it is possible to give a high trackability to errors in the reference clock etc.

Figure 6:
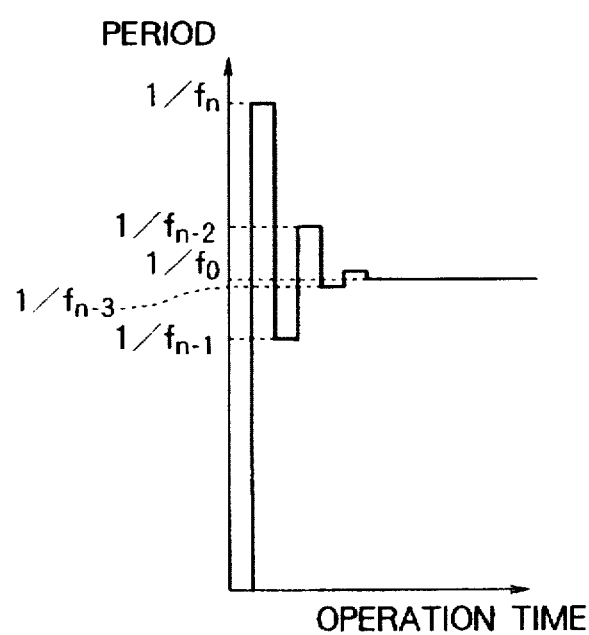
FIG. 6 is a time chart of another operation of the digital counter shown in FIG. 3.

Next, an explanation will be made of another operation of the digital counter 13 shown in FIG. 3 with reference to FIG. 4 and FIG. 6.

In the digital counter 13, the n-th bit is selected in advance as the most significant bit.

Next, as shown in FIG. 4, at the clock C1 in the reference clocks of the frequency $f_{ref}$, "1" is set in the n-th bit. The period of the output from the frequency multiplier 4 at this time becomes the "$1/f_n$" shown in FIG. 6.

Next, at the clock C2 shown in FIG. 4, the frequency $f_{ref}$ of the reference clock and the frequency $f_n$ are compared in phase at the phase comparator 2.

Next, at the clock C3, since the phase comparison at the clock C2 shows that it is necessary to shorten the period, a down signal is output from the phase comparator 2 to the multi-counter 11. Accordingly, the multi-counter 11 determines the n-th bit to be "0" and sets the n−1st bit to "1". The period of the output from the frequency multiplier 4 at this time becomes the "$1/f_{n-1}$" shown in FIG. 6.

Next, at the clock C4 shown in FIG. 4, the frequency $f_{ref}$ of the reference clock and the frequency $f_{n-2}$ are compared in phase at the phase comparator 2.

Next, at the clock C5, since the phase comparison at the clock C4 shows that it is necessary to extend the period, an up signal is output from the phase comparator 2 to the multi-counter 11. Accordingly, the multi-counter 11 determines the n−1st bit to be "1" and sets the n−2nd bit to "1". The period of the output from the frequency multiplier 4 at this time becomes the "$1/f_{n-2}$" shown in FIG. 6.

Next, at the clock C6 shown in FIG. 4, the frequency $f_{ref}$ of the reference clock and the frequency $f_{n-2}$ are compared in phase at the phase comparator 2.

Next, at the clock C7, since the phase comparison at the clock C6 shows that it is necessary to shorten the period, a down signal is output from the phase comparator 2 to the multi-counter 11. Accordingly, the multi-counter 11 determines the n−2nd bit to be "0" and sets the n−3rd bit to "1". The period of the output from the frequency multiplier 4 at this time becomes the "$1/f_{n-3}$" shown in FIG. 6.

Next, processing similar to the above is repeated until the synchronization judgement signal S12 from the synchronization judgement circuit 12 shows that synchronization is established.

Next, when the synchronization judgement signal S12 shows that synchronization has been established, the multi-counter 11 is switched to the up/down counter for counting the count S12 from the least significant bit in accordance with the change of the frequency $f_{ref}$ of the reference clock.

Third Embodiment

Figure 7:
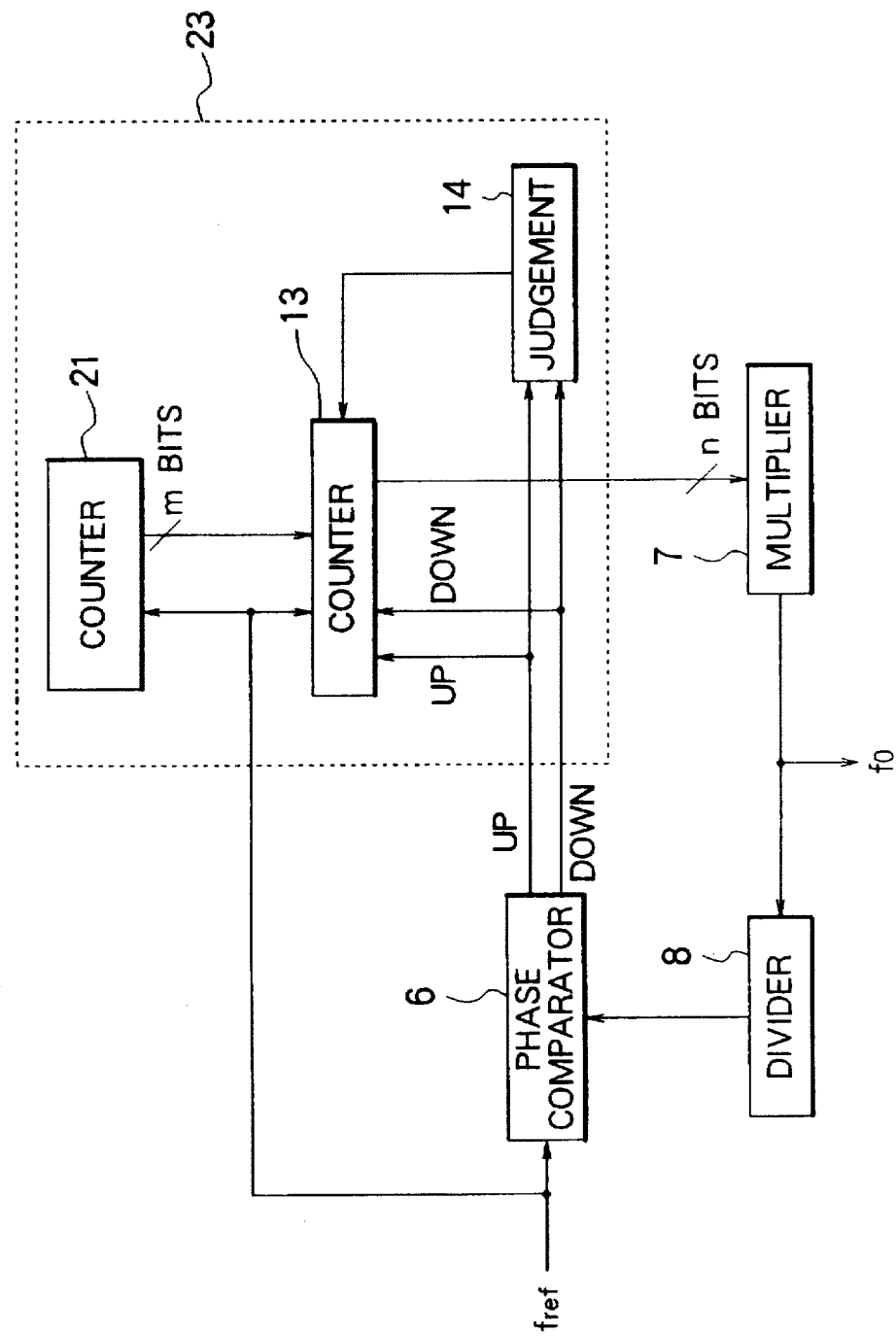
FIG. 7 is a view of the configuration of a digital PLL circuit according to a third embodiment of the present invention.

FIG. 7 is a view of the configuration of a digital PLL circuit according to a third embodiment of the present invention.

As shown in FIG. 7, the digital PLL circuit according to this embodiment has a phase comparator 6, digital counter 13, frequency multiplier 7, and frequency divider 8.

The digital counter 13 has a multi-counter 13, a synchronization judgement circuit 14, and a most significant bit determining counter 21.

The most significant bit determining counter 21 of the digital counter 13 is provided internally or externally with an oscillator for generating a signal of a frequency higher than the reference clock. The most significant bit determining counter 21 counts by an up counter the period of the reference clock based on the clock from the oscillator and selects the optimal most significant bit by a selector from the relationship between the count and the multiplying factor of the frequency multiplier 7.

Figure 8:
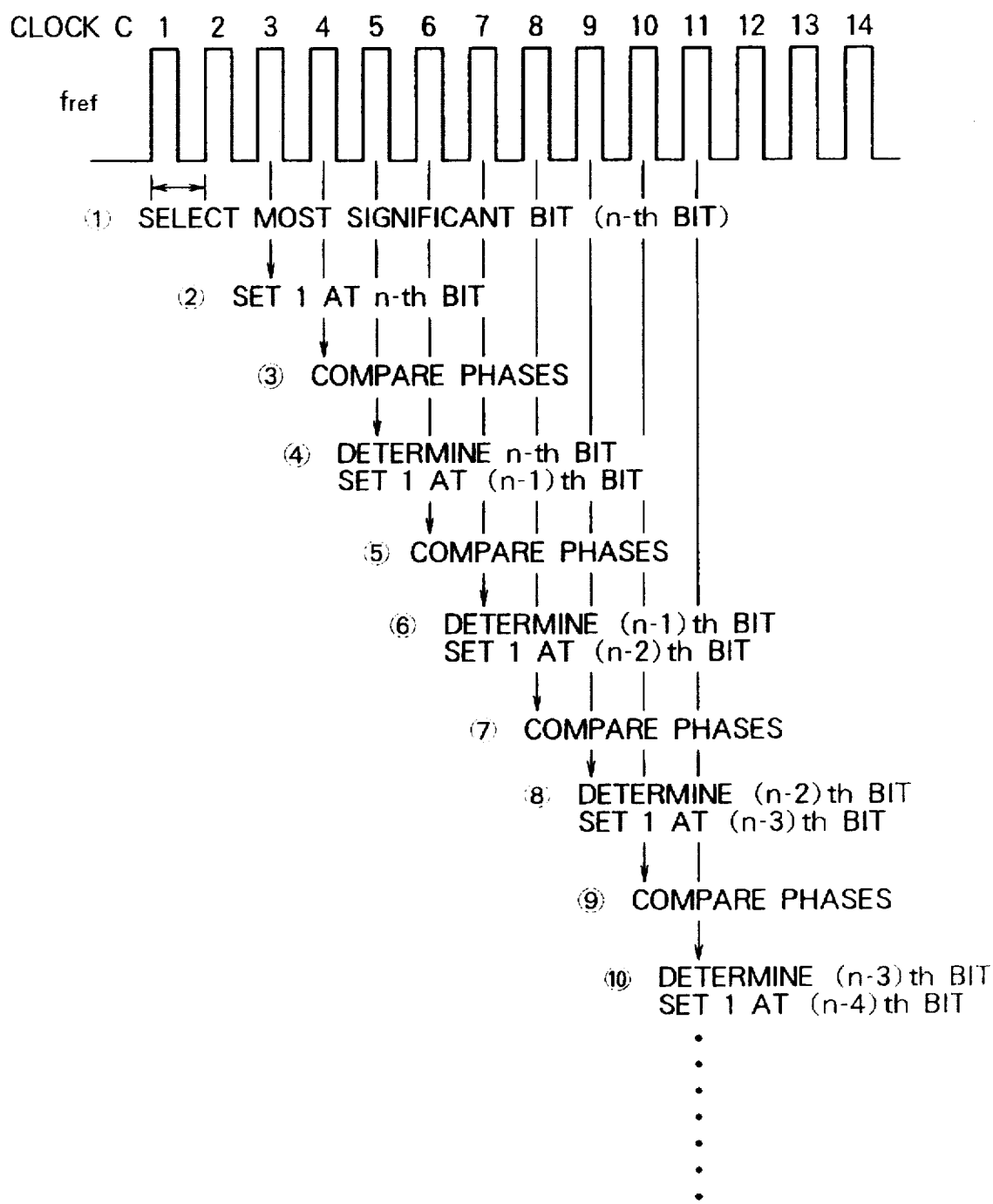
FIG. 8 is a view explaining the operation of the digital counter shown in FIG. 7.

FIG. 8 is a view explaining the operation of the digital counter 13 shown in FIG. 7.

As shown in FIG. 8, in the digital counter 13 shown in FIG. 7, the most significant bit is selected by the most significant bit determining counter 21 at the clock C1 in the reference clocks.

After the clock C2, the multi-counter 13 uses the most significant bit selected at the clock C1 to perform a similar operation as in the second embodiment explained above.

By using the digital counter 13 of this embodiment, it is possible to suitably set the most significant bit, so it is possible to easily increase the range of the frequency handled by the digital PLL circuit.

Fourth Embodiment

Figure 9:
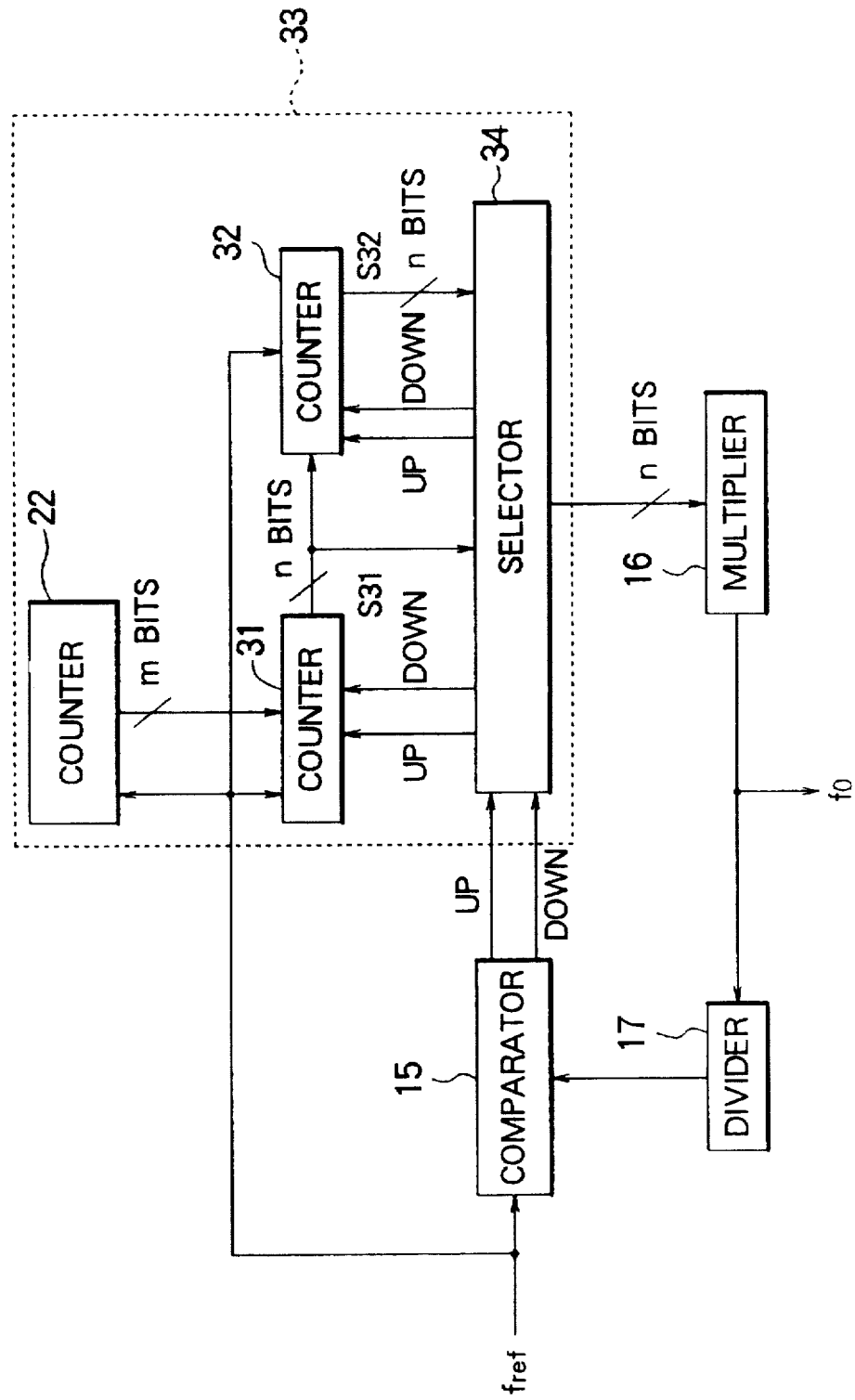
FIG. 9 is a view of the configuration of a digital PLL circuit according to a fourth embodiment of the present invention.

FIG. 9 is a view of the configuration of a digital PLL circuit according to a fourth embodiment of the present invention.

As shown in FIG. 9, the digital PLL circuit according to this embodiment has a phase comparator 15, digital counter 33, frequency multiplier 16, and frequency divider 17.

The digital counter 33 has a first counter 21, second counter 32, synchronization judgement selector 34, and most significant bit determining counter 22.

The first counter 31 receives as input an up/down signal through the synchronization judgement selector 34 from the phase comparator 15 and determines the output of the bits from the most significant bit determined by the most significant bit determining counter 22 to the least significant bit based on this up/down signal.

The second counter 32 uses as its initial value the output S31 of the first counter 31 just after phase synchronization and after the shift period counts up/down in accordance with the change of the reference clock based on the up/down signal from the synchronization judgement selector 34.

The synchronization judgement selector 34 judges if phase synchronization has been established from the up/down signal from the phase comparator 15 and outputs the up/down signal from the phase comparator 15 to the first counter 31 and outputs the output S31 of the first counter to the frequency multiplier 16 until just before phase synchronization. Further, the synchronization judgement selector 34 outputs the up/down signal from the phase comparator 15 to the second counter 32 and outputs the output S32 of the second counter 32 to the frequency multiplier 16 from just after phase synchronization.

Even when using the digital counter 33 according to this embodiment, the digital PLL circuit can give a similar effect as that shown in the second and third embodiments.

The present invention is not limited to the above embodiments in so far as it can successively determine the count of the digital counter from the most significant bit to the least significant bit based on the results of comparison in the phase comparator 2.

What is claimed is:

1. A digital counter comprising:
   a synchronization judging means; and
   a counting means; wherein:
   said synchronization judging means receives as an input signal results of a comparison from a phase comparison circuit which compares a phase of a reference signal and a phase of an output signal of a frequency factoring means;
   said synchronization judging means outputs a phase synchronization judgment signal to said counting means;
   said counting means receives as input said results of said comparison and said phase synchronization judgment signal and performs a count based on said results of the comparison, successively determining said count from a most significant bit to a least significant bit; and
   said counting means successively determines the count from the most significant bit to the least significant bit based on said results of said comparison until said phase of said output signal of said frequency factoring means is synchronized with said phase of said reference signal, and said counting means changes the count from the least significant bit to the most significant bit based on the results of the comparison after synchronization of the phase of said reference signal and said output signal of said frequency factoring means.

2. A digital counter as set forth in claim 1, wherein:

said counting means has a first counting means and a second counting means;

said first counting means successively determines the count from the most significant bit to the least significant bit based on said results of said comparison until said phase of said output signal of said frequency factoring means is synchronized with said phase of said reference signal; and said second counting means changes the count from the least significant bit based on the results of the comparison after synchronization of the phase of said reference signal and said output signal of said frequency factoring means.

3. A digital phase locked loop (PLL) circuit comprising:

a frequency factoring means;

a phase comparing means for comparing a phase of a reference signal and a phase of an output signal of said frequency factoring means; and a digital counter having a counting means and a synchronization judging means;

wherein said synchronization judging means receives as input results of the comparison from said phase comparing means and outputs to said counting means a phase synchronization judgment signal, and wherein said counting means successively determines a count from a most significant bit to a least significant bit based on said results of said comparison and outputs said count to said frequency factoring means; and further wherein the count is changed from the least significant bit to the most significant bit based on the results of said comparison after the phases of the reference signal and the output signal of the frequency factoring means are synchronized.

4. A digital PLL circuit as set forth in claim 3, wherein said frequency factoring means comprises a frequency multiplying means and a frequency dividing means connected in cascade.

5. A digital PLL circuit as set forth in claim 3, wherein a position of the most significant bit of said counting means is determined based on a period of said reference signal and a factor of said frequency factoring means.

6. A digital counter comprising:

a synchronization judging circuit; and a counter; wherein:

said synchronization judging circuit receives as an input signal results of a comparison from a phase comparison circuit which compares a phase of a reference signal and a phase of an output signal of a frequency factoring circuit;

said synchronization judging circuit outputs a phase synchronization judgment signal to said counter;

said counter receives as input said results of said comparison and said phase synchronization judgment signal and successively determines a count from a most significant bit to a least significant bit; and said counter successively determines the count from the most significant bit to the least significant bit based on said results of said comparison until said phase of said output signal of said frequency factoring circuit is synchronized with said phase of said reference signal, and changes the count from the least significant bit to the most significant bit based on the results of the comparison after synchronization of the phase of said reference signal and said output signal of said frequency factoring circuit.

7. A digital counter as set forth in claim 6, wherein:

said counter has a first counting circuit and a second counting circuit;

said first counting circuit successively determines the count from the most significant bit to the least significant bit based on said results of said comparison until said phase of said output signal of said frequency factoring circuit is synchronized with said phase of said references signal; and said second counting circuit changes the count from the least significant bit to the most significant bit based on the results of the comparison after synchronization of the phase of said reference signal and said output signal of said frequency factoring circuit.

8. A digital phase locked loop (PLL) circuit comprising:

a frequency factoring circuit;

a phase comparing circuit for comparing a phase of a reference signal and a phase of an output signal of said frequency factoring circuit; and a digital counter having a counting circuit and a synchronization judging circuit;

wherein said synchronization judging circuit receives as input results of the comparison from said phase comparing circuit and outputs to said counting circuit a phase synchronization judgment signal, wherein said counting circuit successively determines a count from a most significant bit to a least significant bit based on said results of said comparison and outputs said count to said frequency factoring circuit, and wherein the count is changed from the least significant bit to the most significant bit based on the results of said comparison after the phases of the reference signal and the output signal of the frequency factoring circuit are synchronized.

9. A digital PLL circuit as set forth in claim 8, wherein said frequency factoring circuit comprises a frequency multiplying circuit and a frequency dividing circuit connected in cascade.

10. A digital PLL circuit as set forth in claim 8, wherein a position of the most significant bit of said counting circuit is determined based on a period of said reference signal and a factor of said frequency factoring circuit.

11. A digital phase locked loop (PLL) circuit comprising:

a frequency factoring circuit;

a phase comparator which compares a phase of a reference signal and a phase of an output signal of said frequency factoring circuit; and a digital counter which receives the output of the phase comparator and which successively determines a count from a most significant bit to a least significant bit based on said output of said comparator, said digital counter outputting said count to said frequency factoring circuit;

wherein the count is changed from the least significant bit to the most significant bit based on the results of said comparison after the phases of the reference signal and the output signal of the frequency factoring circuit are synchronized.

12. A digital PLL circuit as set forth in claim 11, wherein said frequency factoring circuit comprises a frequency multiplying circuit and a frequency dividing circuit connected in cascade.

13. A digital phase locked loop (PLL) circuit comprising:
- a frequency factoring circuit;
- a phase comparator for comparing a phase of a reference signal and a phase of an output signal of said frequency factoring circuit;
- a synchronization judging circuit; and
- a counter;

wherein said synchronization judging circuit receives as input results of the comparison from said phase comparator and outputs to said counter a phase synchronization judgment signal, and wherein said counter successively determines a count from a most significant bit to a least significant bit based on said results of said comparison and outputs said count to said frequency factoring means, wherein a position of the most significant bit of said counter is determined based on a period of said reference signal and a factor of said frequency factoring circuit.

* * * * *

UNITED STATES PATENT AND TRADEMARK OFFICE
CERTIFICATE OF CORRECTION

PATENT NO. :   5,896,428
DATED      :   April 20, 1999
INVENTOR(S):   Hiroshi YANAGIUCHI It is certified that error appears in the above-identified patent and that said Letters Patent is hereby corrected as shown below:

Claim 2 and 7 should read:

2. A digital counter as set forth in claim 1, wherein:

said counting means has a first counting means and a second counting means;

said first counting means successively determines the count from the most significant bit to the least significant bit based on said results of said comparison until said phase of said output

UNITED STATES PATENT AND TRADEMARK OFFICE
CERTIFICATE OF CORRECTION

PATENT NO.  : 5,896,428
DATED       : April 20, 1999
INVENTOR(S) : Hiroshi YANAGIUCHI It is certified that error appears in the above-identified patent and that said Letters Patent is hereby corrected as shown below:

signal of said frequency factoring means is synchronized with said phase of said reference signal; and said second counting means changes the count from the least significant bit to the most significant bit based on the results of the comparison after synchronization of the phase of said reference signal and said output signal of said frequency factoring means.

7. A digital counter as set forth in claim 6, wherein: said counter has a first counting circuit and a second counting circuit;

said first counting ciruit successively determines the count from the most significant bit to the least significant bit based on said results of said comparison until said phase of said output signal of said frequency factoring circuit is synchronized with said phase of said reference signal; and

UNITED STATES PATENT AND TRADEMARK OFFICE
CERTIFICATE OF CORRECTION

PATENT NO. : 5,896,428
DATED      : April 20, 1999
INVENTOR(S) : Hiroshi YANAGIUCHI It is certified that error appears in the above-identified patent and that said Letters Patent is hereby corrected as shown below:

said second counting circuit changes the count from the least significant bit to the most significant bit based on the results of the comparison after synchronization of the phase of said reference signal and said output signal of said frequency factoring circuit.

Signed and Sealed this

Twelfth Day of October, 1999

*Attest:*

Q. TODD DICKINSON

*Attesting Officer*        Acting Commissioner of Patents and Trademarks